(12) United States Patent
Murray et al.

(10) Patent No.: US 10,522,398 B2
(45) Date of Patent: Dec. 31, 2019

(54) MODULATING METAL INTERCONNECT SURFACE TOPOGRAPHY

(71) Applicant: International Business Machines Corporation, Armonk, NY (US)

(72) Inventors: Conal Murray, Yorktown Heights, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/692,192

(22) Filed: Aug. 31, 2017

(65) Prior Publication Data

US 2019/0067092 A1    Feb. 28, 2019

(51) Int. Cl.
*H01L 21/768* (2006.01)
*H01L 21/321* (2006.01)
(Continued)

(52) U.S. Cl.
CPC ...... *H01L 21/76846* (2013.01); *B24B 37/044* (2013.01); *C09G 1/02* (2013.01);
(Continued)

(58) Field of Classification Search
CPC ........... H01L 23/53238; H01L 23/5226; H01L 23/53295; H01L 21/76843; H01L 21/76877
See application file for complete search history.

(56) References Cited

U.S. PATENT DOCUMENTS 5,011,580 A   4/1991 Pan et al.
5,236,551 A   8/1993 Pan
(Continued)

FOREIGN PATENT DOCUMENTS

CN   105419651 A   3/2016
CN   106118495 A   11/2016

OTHER PUBLICATIONS

Turk et al., "Investigation of Percarbonate Based Slurry Chemistry for Controlling Galvanic Corrosion during CMP of Ruthenium", ECS Journal of Solid State Science and Technology, 2 (5), pp. P205-P213, 2013, © The Electrochemical Society.
(Continued)

*Primary Examiner* — Zandra V Smith
*Assistant Examiner* — John M Parker
(74) *Attorney, Agent, or Firm* — Nathan M. Rau (57) ABSTRACT

A metal interconnect structure can be fabricated within an integrated circuit (IC). A recess can be created in an IC dielectric layer and a surface modulation liner can be formed by depositing two different metallic elements onto the surfaces of the recess. One metallic element can have a standard electrode potential greater than a standard electrode potential of an interconnect metal, and the other metallic element can have a standard electrode potential less than the standard electrode potential of the interconnect metal. A metal interconnect structure can be formed by filling the remainder of the recess with interconnect metal, which is physically separated from the dielectric layer by the surface modulation liner. The surface topography of the metal interconnect structure can be modulated with a polishing process, by removing a top portion of the interconnect metal and a top portion of the surface modulation liner.

13 Claims, 4 Drawing Sheets

(51) Int. Cl.
*B24B 37/04* (2012.01)
*C09G 1/02* (2006.01)
*H01L 23/532* (2006.01)
*H01L 21/311* (2006.01)

(52) U.S. Cl.
CPC .... *H01L 21/3212* (2013.01); *H01L 21/76858* (2013.01); *H01L 23/53238* (2013.01); *H01L 21/31111* (2013.01); *H01L 2924/0002* (2013.01)

(56) References Cited

U.S. PATENT DOCUMENTS

| | | | |
|---|---|---|---|
| 5,656,554 | A | 8/1997 | Desai et al. |
| 6,150,260 | A | 11/2000 | Roy |
| 6,225,223 | B1 | 5/2001 | Liu et al. |
| 6,340,601 | B1 | 1/2002 | Curran, Jr. et al. |
| 6,376,376 | B1 | 4/2002 | Lim et al. |
| 6,884,724 | B2 | 4/2005 | Hsu et al. |
| 6,982,227 | B2 | 1/2006 | Cooney, III et al. |
| 7,008,803 | B2 | 3/2006 | Kane et al. |
| 7,052,997 | B2 | 5/2006 | Sandhu |
| 7,265,055 | B2 | 9/2007 | Thompson et al. |
| 7,935,242 | B2 | 5/2011 | Klein et al. |
| 8,570,638 | B2 | 10/2013 | Lu et al. |
| 9,024,296 | B2 | 5/2015 | Sundaram et al. |
| 9,190,285 | B1 | 11/2015 | Abdallah et al. |
| 9,885,936 | B2 | 2/2018 | Watanabe et al. |
| 2002/0072226 | A1* | 6/2002 | Ueno ............... H01L 21/76807 438/637 |
| 2002/0180052 | A1 | 12/2002 | Layadi et al. |
| 2003/0207561 | A1* | 11/2003 | Dubin ................. H01L 21/288 438/630 |
| 2007/0227907 | A1* | 10/2007 | Shah .................... G01N 27/307 205/777.5 |
| 2008/0105652 | A1 | 5/2008 | Brusic et al. |
| 2008/0148649 | A1 | 6/2008 | Liu |
| 2011/0017499 | A1 | 1/2011 | Yang et al. |
| 2012/0045970 | A1 | 2/2012 | Li et al. |
| 2013/0140273 | A1 | 6/2013 | Lu et al. |
| 2016/0027657 | A1 | 1/2016 | Shi et al. |
| 2016/0108285 | A1 | 4/2016 | Kraft et al. |

OTHER PUBLICATIONS

Tamboli et al., "Investigating the compatibility of Ruthenium Barrier with Copper Interconnects", ECS Transactions, 33 (10), pp. 181-187, 2010, © The Electrochemical Society.
Sagi et al., "Investigation of Guanidine Carbonate-Based Slurries for Chemical Mechanical Polishing of Ru/TiN Barrier Films with Minimal Corrosion", ECS Journal of Solid State Science and Technology, 3 (7), pp. P227-P234, 2014.
Sagi et al., "Potassium Permanganate-Based Slurry to Reduce the Galvanic Corrosion of the Cu/Ru/TiN Barrier Liner Stack during CMP in the BEOL Interconnects", ECS Journal of Solid State Science and Technology, 5 (5), pp. P256-P263, 2016.
Peethala et al., "Cobalt Polishing with Reduced Galvanic Corrosion at Copper/Cobalt Interface Using Hydrogen Peroxide as an Oxidizer in Colloidal Silica-Based Slurries", Journal of The Electrochemical Society, 159 (6), pp. H582-H588, 2012.
Peethala et al., "Controlling the Galvanic Corrosion of Copper during Chemical Mechanical Planarization of Ruthenium Barrier Films", Electrochemical and Solid-State Letters, 14 (7), pp. H306-H310, 2011.
Nishizawa et al., "Fundamental Study of Chemical-Mechanical Polishing Slurry of Cobalt Barrier Metal for the Next-Generation Interconnect Process", Japanese Journal of Applied Physics 49, 2010, 3 pages.
Maruyama et al., "Galvanic Corrosion Control in Chemical Mechanical Polishing of Cu Interconnects with Ruthenium Barrier Metal Film", Japanese Journal of Applied Physics 48, 2009, 5 pages.
Li et al., "Effect of Chelating Agent on Reducing Galvanic Corrosion between Cobalt and Copper in Alkaline Slurry", ECS Journal of Solid State Science and Technology, 5 (9), pp. P540-P545, 2016.
Jiang et al., "Investigation on the Galvanic Corrosion of Copper during Chemical Mechanical Polishing of Ruthenium Barrier Layer", International Conference on Planarization/CMP Technology, Nov. 19-21, 2014, pp. 209-216.
Hsu et al., "Optimized Copper Chemical Mechanical Polishing with CVD Co Barrier at 14nm Technology Node", International Conference on Planarization/CMP Technology, Nov. 19-21, 2014, pp. 63-65.

* cited by examiner

MODULATING METAL INTERCONNECT SURFACE TOPOGRAPHY

BACKGROUND

The present disclosure generally relates to the fabrication of semiconductor devices. In particular, this disclosure relates to the creation of metal interconnect structures within a dielectric layer of an integrated circuit (IC).

An IC, also known as a "microchip," silicon or computer "chip," is a specially prepared piece of silicon, or other semiconductor material, into which a complex electronic circuit is etched and formed using a photolithographic process. IC types can include computer processors, memory, analog, and customizable devices. ICs can be relatively fragile, and therefore are often mounted on and/or surrounded by a protective, supportive ceramic or plastic package. Electrical connections to the chip can be provided through metal contacts, which can include pins or solder balls located on the exterior of the chip package.

Galvanic or bimetallic corrosion is an electrochemical process in which one metal preferentially corrodes when in electrical contact, in the presence of an electrolyte, with a dissimilar metal. Dissimilar metals and alloys have different standard electrode potentials, and when two or more dissimilar metals are brought into electrical contact in the presence of an electrolyte, one metal acts as an anode and the other as a cathode. If the electrolyte contains only metal ions that are not easily reduced, the cathode reaction is reduction of dissolved $H^+$ to $H_2$ or $O_2$ to $OH^-$. The electropotential difference between the reactions at the two electrodes is the driving force for an accelerated corrosive attack on the anode metal, which dissolves into the electrolyte. This electropotential difference leads to the acceleration of the anode metal corrosion and the inhibition of the cathode metal corrosion.

SUMMARY

Embodiments may be directed towards a method for fabricating, within an integrated circuit (IC), a metal interconnect structure having a modulated surface topography. The method includes creating, in a top surface of a dielectric layer of the IC, a recess having at least one side and a bottom. The method also includes forming a surface modulation liner by depositing at least two different metallic elements onto the at least one side and onto the bottom of the recess. A first element of the at least two different metallic elements has a first standard electrode potential greater than a standard electrode potential of an interconnect metal, and a second element of the at least two different metallic elements has a second standard electrode potential less than the standard electrode potential of the interconnect metal. The method also includes forming the metal interconnect structure by filling a portion of the recess not filled by the surface modulation liner with the interconnect metal, the interconnect metal being physically separated from the dielectric layer by the surface modulation liner. The method also includes modulating, with a polishing process, the surface topography of the metal interconnect structure by removing a top portion of the interconnect metal and a top portion of the surface modulation liner.

Embodiments may also be directed towards an IC including a metal interconnect structure within a dielectric layer of the IC. The IC includes a recess having at least one side and a bottom, in a top surface of the dielectric layer. The IC also includes a surface modulation liner including at least two different metallic elements deposited onto the at least one side and onto the bottom of the recess. A first element of the at least two different metallic elements has a first standard electrode potential greater than a standard electrode potential of an interconnect metal, a second element of the at least two different metallic elements has a second standard electrode potential less than the standard electrode potential of the interconnect metal. The IC also includes the interconnect metal that is physically separated from the dielectric layer by the surface modulation liner. The interconnect metal fills a portion of the recess not filled by the surface modulation liner and has a surface topography that is modulated.

Embodiments may also be directed towards a design structure embodied on a computer-readable storage medium readable by a machine used in design, manufacture, and simulation of an IC metal interconnect structure. The design structure includes elements that, when processed in a semiconductor manufacturing facility, produce an IC. The IC includes a recess having at least one side and a bottom, in a top surface of the dielectric layer. The IC also includes a surface modulation liner including at least two different metallic elements deposited onto the at least one side and onto the bottom of the recess. A first element of the at least two different metallic elements has a first standard electrode potential greater than a standard electrode potential of an interconnect metal, a second element of the at least two different metallic elements has a second standard electrode potential less than the standard electrode potential of the interconnect metal. The IC also includes the interconnect metal that is physically separated from the dielectric layer by the surface modulation liner. The interconnect metal fills a portion of the recess not filled by the surface modulation liner and has a surface topography that is modulated.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing enhanced surface planarity to metal interconnect structures within integrated circuits (ICs) such as processors and memory chips. Such ICs may be used to provide high-performance and high-reliability data processing capability for electronic devices including computing systems and servers. Such computing systems and servers may include, but are not limited to, web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing high-performance and high-reliability data processing capability to electronic equipment such as computing systems, which may be used in a wide variety of computational and data processing applications. Such computing systems may include, but are not limited to, supercomputers, high-performance computing (HPC) systems, and other types of special-purpose computers. Embodiments may also be directed towards providing high-performance and high-reliability data processing capability to consumer electronic devices such as cell phones, tablets, personal computers and Internet routing devices.

The term "chemical-mechanical polishing" (CMP) is used herein in reference to a polishing process involving mechanical polishing, in conjunction with the application of a chemically active slurry, of a semiconductor wafer. The term CMP can also refer to "chemical-mechanical planarization" without loss of meaning, as the result of the polishing operation is the planarization of the semiconductor wafer surface.

Embodiments of the present disclosure can be useful for creating cost-effective metal interconnect structures, within an IC, that have a relatively planar top surface topology relative to IC metal interconnect structures created using other fabrication techniques. Such metal interconnect structures can be fabricated by using existing and proven IC design and fabrication techniques and IC materials sets.

For ease of illustration and discussion, the structure and fabrication of a single IC metal interconnect structure is depicted and described herein. This depiction and description, however, does not limit the scope of the present disclosure. In some embodiments, according to existing IC fabrication technology and material sets, several IC metal interconnect structures may be simultaneously created, as a result of the execution of process operations depicted and described herein. For example, a set of process operations may be applied to a significant portion of, or to the entirety of, a dielectric layer of an IC that contains multiple metal interconnect structures created using a damascene process, consistent with existing IC fabrication methods.

Continuing advances in IC fabrication technology have led to a simultaneous increase in the density of ICs and decrease in the size of active devices, i.e., transistors, and metal structures, i.e., wires, used to interconnect active devices. As an example, an IC having transistors with 22 nm gate lengths may have corresponding interconnect wires having a width of 50 nm or less. The reliable production of ICs having reduced feature sizes, such as gate lengths and interconnect structures, can create significant material processing challenges. The reliable and reproducible fabrication of interconnect features can be of critical importance to the production of reliable ICs.

Metals such as copper can be used to create electrical interconnect structures through the use of a damascene process. Creating an electrical interconnect structure through a damascene process includes creating a recess or trench within a dielectric layer of the IC and subsequently lining the recess with a barrier or liner material such as cobalt or ruthenium. The recess is subsequently filled with a metal, e.g., copper, or metal alloy including copper, in order to form a metal interconnect structure or wire within the recess. Following the deposition of the liner material and the interconnect metal, a polishing operation such as CMP can be used to level or planarize the top surface of the interconnect metal. The top surface is planarized in preparation for the formation of subsequent electrically interconnected via (s) and/or wire structures above the interconnect metal. The preparation of a substantially level top surface of the interconnect metal can be critical to reliable, robust electrical interconnection of the interconnect structure to subsequently fabricated interconnect layers.

The metallic elements such as cobalt and ruthenium used to line the recess can have a standard electrode potential ($E^0$) that is greater or less than the standard electrode potential of metals such as copper that are used to form the metal interconnect structure. This difference in standard electrode potentials ($\Delta E^0$) can create a voltage differential at the interface between the two dissimilar metals. During a CMP process, this relatively local voltage differential at the interface between the dissimilar metals can either accelerate or decelerate the polishing/corrosion rate(s) in these areas relative to other areas of the interconnect metal surface. The results of these altered polishing rates can include the formation of a concave top surface of the interconnect metal, also known as "dishing," or the formation of a convex top surface, which can result in narrow "slit voids" adjacent to the dissimilar metal interface. The formation of either concave or convex features on the metal interconnect structure top surface can result in reduced reliability and performance of electrical interconnections at the interface between the metal interconnect structure and other interconnect structures.

According to embodiments, a barrier or liner material having a cumulative $E^0$ that is similar to that of an interconnect metal can be deposited, to create a liner within a recess formed within a dielectric layer of an IC. A reduced $\Delta E^0$ between the liner and the interconnect metal can be useful in mitigating or eliminating detrimental top surface artifacts, such as concave or convex profiles, from being formed on the interconnect metal during a polishing operation. Mitigation of such artifacts can result in increased reliability and electrical performance of subsequent electrical connections to the metal interconnect structure.

Figure 1:
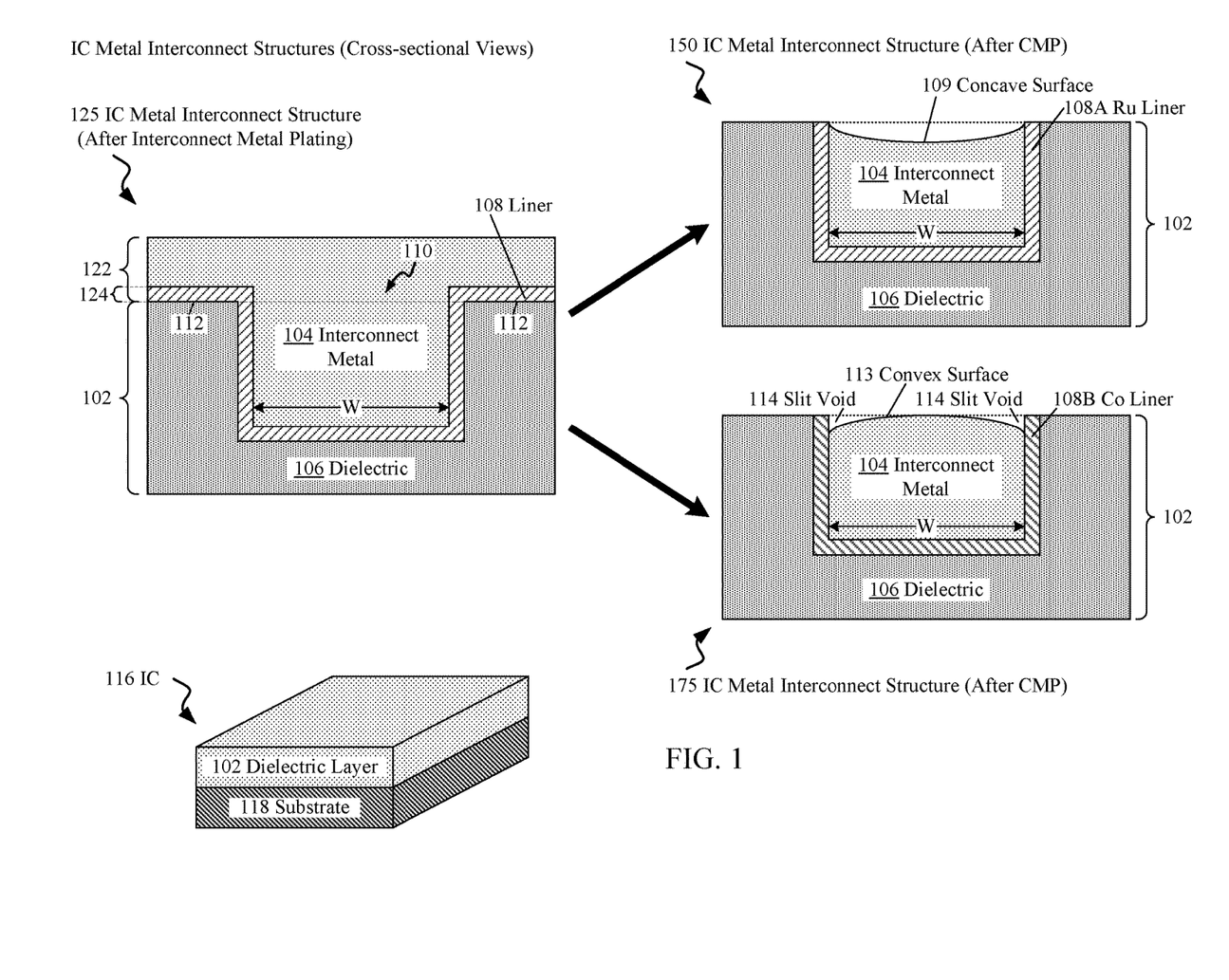
FIG. 1 depicts cross-sectional views of an integrated circuit (IC) and IC metal interconnect structures, according to embodiments of the present disclosure.

FIG. 1 depicts a cross-sectional view 116 of an IC and consistent cross-sectional views 125, 150 and 175 of IC metal interconnect structures formed using a damascene fabrication process. View 125 depicts an IC metal interconnect structure following an interconnect metal deposition process such as electroplating. Views 150 and 175 depict consistent metal interconnect structures following a subsequent polishing, e.g., CMP, process. Views 150 and 175 can be useful in depicting features of the metal interconnect structure, such as a concave or convex surface, which can be detrimental to the formation of highly reliable, high-performance electrical interconnects to other interconnect structures such as vias or wires.

View 125 depicts a cross-sectional view of a metal interconnect structure formed within a dielectric layer 102 of an IC, prior to a planarization of the interconnect metal 104. The interconnect structure includes interconnect liner 108, deposited onto the surfaces of a recess 110 within the dielectric layer 102, and interconnect metal 104, subsequently deposited within the portion of the recess 110 not filled by liner 108. In accordance with certain metal deposition processes, a secondary portion 124 of liner 108 and the secondary portion 122 of interconnect metal 104 may be deposited on a top surface 112 of the dielectric layer 102. In accordance with various semiconductor materials sets, dielectric 106 can be an insulating material such as silicon dioxide or a low-k dielectric material such as organosilicate glass (OSG). Interconnect metal 104 can consist of copper or a metallic alloy including copper, and liner 108 can consist of or include metallic elements such as cobalt, ruthenium, titanium, platinum, palladium and tantalum and their nitrides and alloys. In accordance with design rules for certain IC technologies having submicron features sizes, width "W" of the recess 110 can be 50 nm or less.

View 150 depicts a cross-sectional view, generally consistent with view 125, of a metal interconnect structure following a planarization of the interconnect metal 104. The metal interconnect structure includes a ruthenium liner 108A, deposited onto the surfaces of recess 110 within the dielectric layer 102, and a copper interconnect metal 104, subsequently deposited within the portion of the recess 110 not filled by ruthenium liner 108A. Consistent with view 125, dielectric 106 is an insulating material such as silicon dioxide or OSG.

During a CMP operation including a polishing slurry that acts as an electrolyte, the ruthenium liner 108A has a "negative" galvanic reaction to the subsequently deposited copper interconnect metal 104, as the copper is less noble than the ruthenium. The $\Delta E^0$ between ruthenium and copper is −0.34 V. The result, during a CMP operation, of this $\Delta E^0$ is depicted by the concave or "dished" surface 109 of interconnect metal 104. The concave surface 109 results from a deceleration of the polishing/corrosion of the copper adjacent to the ruthenium liner relative to the rate of polishing/corrosion of the copper further away from the ruthenium liner.

View 175 depicts a cross-sectional view, generally consistent with view 125, of a metal interconnect structure following a planarization of the interconnect metal 104. The metal interconnect structure includes a cobalt liner 108B, deposited onto the surfaces of recess 110 within the dielectric layer 102, and a copper interconnect metal 104, subsequently deposited within the portion of the recess 110 not filled by cobalt liner 108B. Consistent with view 125, dielectric 106 is an insulating material such as silicon dioxide or OSG.

During a CMP operation including a polishing slurry that acts as an electrolyte, the cobalt liner 108B has a "positive" galvanic reaction to the subsequently deposited copper interconnect metal 104, as the copper is more noble than the cobalt. The $\Delta E^0$ between cobalt and copper is +0.62 V. The result, during a CMP operation, of $\Delta E^0$ is depicted by the convex surface 113 of interconnect metal 104. The convex surface 113 and related slit voids 114 result from the acceleration of the polishing/corrosion of the copper adjacent to the cobalt liner, relative to the rate of polishing/corrosion of the copper further away from the cobalt liner.

The interconnect metal structures depicted in views 150 and 175 are presented by way of example, and do not serve to limit the present disclosure. Other types of liner materials and interconnect metal types can be combined which may, following a CMP operation, yield variations in interconnect metal surface topology, depending on a relative difference between the cumulative liner $E^0$ and the interconnect metal $E^0$.

View 116 is an isometric drawing of an IC, including a substrate 118 and a dielectric layer 102, consistent with the figures. The substrate 118 can be a thin slice or wafer of semiconductor material, such as a silicon crystal, used in the fabrication of ICs, and can have microelectronic devices, such as transistors, fabricated within it.

Dielectric layer 102 can be formed on the top or active device surface of substrate 118, and can include conductive structures, such as wires, separated and electrically insulated by dielectric material, e.g., 106, view 125. Dielectric layer 102 can provide electrical insulation between conductive structures formed within adjacent layers, i.e., layers above and below it. According to embodiments, metal interconnect structures can be fabricated, from interconnect metal 104, within dielectric layer 102, consistent with layers depicted in views 125, 150 and 175 of FIG. 1 and in FIG. 2.

Views 125, 150, 175 and 116 of FIG. 1 illustrate an example depiction of an IC. Some ICs can include additional dielectric layers similar to dielectric layer 102, formed in a stacked, planar arrangement on top of a substrate, e.g., 118. In some ICs, metal interconnect structures can be fabricated within each of a number of dielectric layers such as 102 that are located in a stacked arrangement above a semiconductor layer of an IC.

Figure 2:
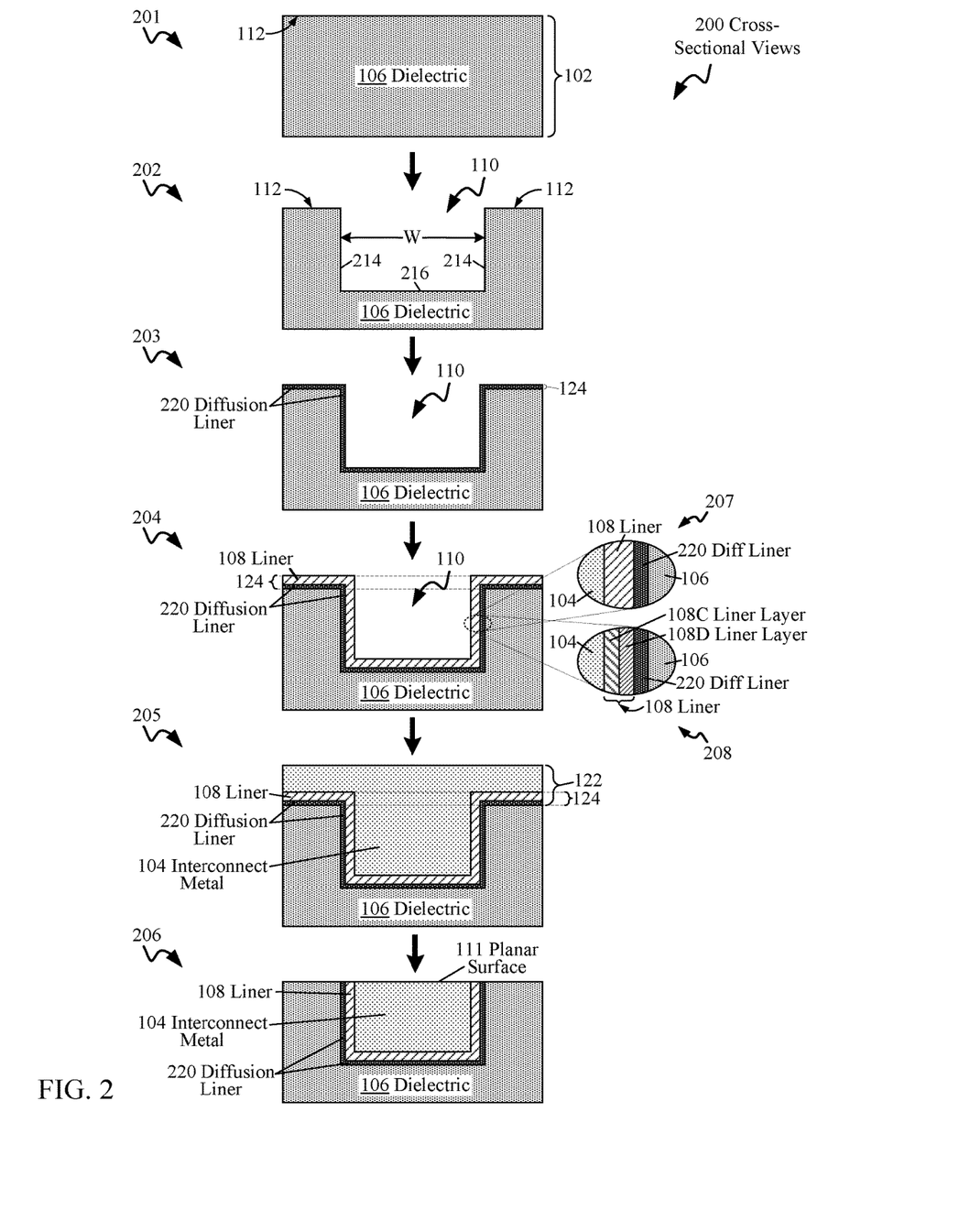
FIG. 2 includes a set of six cross-sectional views and two expanded cross-sectional views that depict the results of process operations for fabricating an IC metal interconnect structure, according to embodiments consistent with the figures.

FIG. 2 includes a set of six cross-sectional views 201-206 and two expanded views 207 and 208, each depicting the results of process operations for fabricating, within a dielectric layer 102 of an IC, metal interconnect structures having modulated surface topography, according to embodiments consistent with the figures. These views illustrate an example process; other views and operations can be possible. A metal interconnect structure formed by these process operations can be consistent with metal interconnect structures depicted in views 150 and 175, FIG. 1, and can have, following a polishing operation, a relatively planar top surface compared to that depicted in views 150 and 175, FIG. 1. The cross-sectional views 201-208 depicted herein generally correspond to the operations 302-314, FIG. 3, and their associated descriptions.

The progression depicted in views 201-208 begins with a dielectric layer 102, view 201, of an IC and ends with, in view 206, a completed metal interconnect structure having a relatively planar top surface. According to embodiments, the planar surface 111 of the metal interconnect structure depicted in view 206 results from a cumulative $E^0$ of the liner 108 being relatively similar to the $E^0$ of interconnect metal 104. This matching of $E^0$s can result in the mitigation of the concave and convex surface topologies of interconnect metal 104 as depicted, for example, in FIG. 1.

Process operations can be completed within structural layer(s) which can be presently used for IC fabrication, such as dielectric layer 102. A metal interconnect structure fabricated using these process operations, as depicted in view 206, can be particularly useful in providing electrical interconnections for signals, power and ground between circuit elements/nodes within the IC.

The results of one or more process operations may be depicted in each view. For example, a view can depict the results of one or more deposition processes, which can also include photomask operations, such as the application, exposure, developing and removal of photomask material, that support the deposition process. Processing operations associated with views 201-208 can include, but are not limited to, material etching, material layer deposition, layer planarization/polishing and associated photolithographic masking processes and operations.

Completed structures may be generally shown in views 201-208 as having rectangular cross-sectional profiles, with surfaces orthogonal to each other. This depiction, however, is not limiting; structures can be of any suitable shape, size and profile, in accordance with specific design criteria, lithographic and manufacturing process limitations and tolerances for a given application. For example, corners shown as having right angles can be rounded, surfaces can have a non-orthogonal relative orientation, and relative dimensional ratios can vary from those depicted in the figures.

The views 201-208 can be useful in illustrating operations and details involved in creating a metal interconnect structure having a mitigated surface topology that is more planar than surface topologies achievable through other methods of metal interconnect structure fabrication. The operations depicted in the views 201-208 involve IC layers located above a semiconductor substrate. Such operations can be included within existing back-end-of-line (BEOL) IC fabrication processes.

View 201 depicts a dielectric layer 102 of an IC, prior to completion of any processing operations used to form a metal interconnect structure. Dielectric layer 102 can be consistent with IC dielectric layers used to provide electrical insulation between metal layers of an IC. Dielectric layer 102 has a top surface 112 and can be formed onto a substrate, e.g., 118, FIG. 1, or onto an IC layer containing primarily metal interconnects. Dielectric 106 of dielectric layer 102 can include electrically insulative materials such as silicon dioxide or OSG.

View 202 depicts the results of creating a recess 110 in a top surface 112 of dielectric layer 102 of an IC. According to embodiments, recess 110 has at least one side 214 and a bottom 216. According to embodiments, the width "W" of recess 110 can be specified in accordance with design rules for a particular IC interconnect technology. For example, in a complementary metal-oxide semiconductor (CMOS) IC technology having 22 nm gate lengths, the width W of recess 110 can be 50 nm or less. In some embodiments, recess 110 can have a substantially rectangular cross-section, as depicted in views 202-206, and can have a wide range of lengths corresponding to interconnects or wires used within a particular IC design. In some embodiments, the recess sides 214 can be oriented substantially orthogonal to a dielectric layer top surface 112, and in some embodiments, the sides 214 can be sloped relative to the top surface 112 of the dielectric layer 102, according to a particular type of etch process used to form the recess.

The operation of creating the recess 110 in dielectric layer 102 can include the use of etching processes consistent with processes used for metal interconnect and via formation in an IC dielectric layer, including dry etching, plasma etching, anisotropic etching or reactive ion etching (RIE). In embodiments, creating the recess 110 can involve applying a photomask to define recess boundaries, exposing and developing lines in the photoresist, etching the recess 110 in the dielectric layer 102 and stripping off the remaining photomask. According to embodiments, the dimensions of the recess 110 can be consistent with dimensions of metal interconnect used to create electrical interconnections between circuit elements, e.g., transistors, within an IC.

View 203 depicts the results of depositing a diffusion liner 220 onto the sides 214 and the bottom 216 of the recess 110. Certain embodiments can include diffusion liner 220 and certain embodiments may not include diffusion liner 220. A diffusion liner 220 can be useful in promoting adhesion of the liner 108, view 204, to dielectric 106, and can also mitigate the diffusion of interconnect metal 104, view 205, into the dielectric 106.

The operation of depositing a diffusion liner 220 onto the sides 214 and the bottom 216 of the recess 110 can include the use of processes consistent with those used for IC metal deposition. Such processes can include physical vapor deposition (PVD), sputter deposition, chemical vapor deposition (CVD), atomic layer deposition (ALD) and evaporative processes.

According to embodiments, the diffusion liner 220 can include electrically conductive materials, such as titanium, tantalum, titanium nitride or tantalum nitride, which can have a substantially uniform thickness in a range, for example, between 1 nm and 10 nm, when deposited onto the sides 214 and the bottom 216 of the recess 110. In some embodiments, a secondary portion 124 of the diffusion liner 220 can also be deposited on the top surface 112 of dielectric layer 102 during operation 203.

View 204 depicts the results of depositing liner 108 onto sides 214 and bottom 216 of recess 110. In some embodiments, liner 108 can be deposited directly onto sides 214 and bottom 216 of the recess 110, and in some embodiments liner 108 can be deposited onto diffusion liner 220, which has been previously deposited directly onto sides 214 and bottom 216 of the recess 110. According to embodiments, liner 108 includes at least two different metallic elements each having different $\Delta E^0$s. In embodiments, at least one of the metallic elements has an $E^0$ greater than an interconnect metal $E^0$, and another of the metallic elements has an $E^0$ less than an interconnect metal $E^0$. According to embodiments, combining two or more liner metallic elements having and individual $E^0$s that, when summed together, have a magnitude less than either of the individual $E^0$s can be useful in reducing the cumulative $\Delta E^0$ between liner 108 and an interconnect metal 104, view 205. For example, in some embodiments, a sum of the $E^0$s of the two different metallic elements of liner 108 can be in a range between −0.5 V and +0.5 V.

Limiting and/or reducing the cumulative $\Delta E^0$ can be useful in mitigating, during a CMP operation, galvanic-induced corrosion, and resulting surface topography artifacts such as dishing or slit voids on a polished/planarized surface of IC interconnect metal. Management and/or reduction of such surface artifacts can result in an interconnect metal surface with increased planarity, which can enhance both the reliability and electrical performance of the interconnect metal and interface(s) between the interconnect metal and other interconnect structures such as vias. Enhanced reliability and electrical performance of the interconnect metal can result in overall increased reliability and electrical performance of the IC including the interconnect metal.

In some embodiments, liner 108 can include two or more dissimilar metallic elements that are simultaneously co-deposited onto the recess 110 or the diffusion liner 220 to form a liner 108 that is an alloy, as depicted in expanded view 207. Such an alloy liner 108 can have a cumulative $\Delta E^0$ from an interconnect metal that is less than the individual $\Delta E^0$s between each of the dissimilar metallic elements and the interconnect metal. In some embodiments, the proportions of each of the two or more dissimilar metallic elements that are co-deposited onto the recess 110 can be varied in order to create an alloy liner with an $E^0$ within a specified voltage range of the $E^0$ of the interconnect metal.

As an example, the $\Delta E^0$ between ruthenium and copper is −0.34 V and the $\Delta E^0$ between cobalt and copper is +0.62 V. A designer may specify particular proportions of ruthenium and cobalt which, when co-deposited into the recess 110, form a resulting liner 108 having an $E^0$ that is within 0.1 V of the $E^0$ of the interconnect metal, e.g., copper.

In some embodiments, liner 108 can include two or more individual liner layers, e.g., 108C and 108D, view 207, each liner layer including a different metallic element or combination of metallic elements. According to embodiments, individual liner layers can be sequentially deposited onto sides 214 and bottom 216 of the recess 110 or onto the diffusion liner 220, as depicted in expanded view 207.

Such a liner 108 that includes liner layers 108C and 108D can have a cumulative $\Delta E^0$ from an interconnect metal that is less than the individual $\Delta E^0$s between each of the layered dissimilar metallic elements and the interconnect metal. In some embodiments, the number of layers of each of the two or more dissimilar metallic elements that are sequentially deposited onto the recess 110 can be varied in order to create an alloy liner with an $E^0$ within a specified voltage range of the $E^0$ of the interconnect metal.

As an example, the $\Delta E^0$ between tantalum and copper is +0.94 V, the $\Delta E^0$ between ruthenium and copper is −0.34 V and the $\Delta E^0$ between cobalt and copper is +0.62 V. A designer may specify two-layer arrangement of ruthenium and cobalt which, when sequentially deposited into the recess 110, form a resulting liner 108, including liner layers 108C and 108D, having a standard electrode potential of:

$$\Delta E^0 = +0.62 \text{ V} + (-0.34 \text{ V}) = +0.28 \text{ V}$$

Such a $\Delta E^0$ is less than the $\Delta E^0$s of tantalum, ruthenium or cobalt with respect to copper, which can be useful in mitigating galvanic-induced corrosion adjacent to surface interfaces of the interconnect metal and the liner. In some embodiments, the techniques of depositing multiple liner layers and specifying particular proportions of two or more dissimilar metals within the liner layers can be combined to achieve a specified or desired $\Delta E^0$.

According to embodiments, the liner 108 and liner layers 108C and 108D can include metallic elements, such as ruthenium, cobalt, titanium, platinum, palladium and tantalum and their nitrides and alloys, which can have a substantially uniform thickness in a range when deposited onto the sides 214 and the bottom 216 of the recess 110, or onto the diffusion liner 220. The operation of depositing liner 108 can include the use of processes consistent with those used for IC metal deposition, including, but not limited to, PVD, sputter deposition, CVD, ALD and evaporative processes.

In certain embodiments, the thickness of each layer of liner 108 and/or liner layers 108C and 108D can be in a range between 1 nm and 10 nm, and in certain embodiments, the thickness of each layer of liner 108 can be in a more limited range, between 2 nm and 4 nm. The thickness range of each layer of liner 108 may be bounded or determined by a particular process used, for example, atomic layer deposition (ALD), to deposit the liner layer. In some embodiments, a secondary portion 124 of the liner 108 can also be deposited onto the top surface 112 of dielectric layer 102 or onto the diffusion liner 220 during operation 204.

In embodiments, liner 108 can be useful as a metallic surface upon which a "seed" layer of interconnect metal may be easily deposited, which can be useful in facilitating an electroplating process used for the deposition of the interconnect metal 104, view 205, within the recess 110. In addition to reducing the cumulative $\Delta E^0$ between liner 108 and interconnect metal 104, view 205, liner 108 can be useful in mitigating the diffusion of interconnect metal 104 into the dielectric 106.

View 205 depicts the results of filling a portion of the recess 110 that is not filled by the liner 108 and/or diffusion liner 220 with interconnect metal 104 to form a metal interconnect structure within the IC. The operation of filling the recess 110 with interconnect metal 104 can include the use of processes consistent with those used for IC metal deposition, including electroplating, PVD, CVD and ALD. According to embodiments, the filling of the recess 110 with interconnect metal 104 can also include the deposition of a secondary portion 122 of interconnect metal 104 onto a top surface of the secondary portion 124 of the liner 108, which is deposited onto the top surface of either the dielectric layer 102 or the diffusion layer 220. According to embodiments, the interconnect metal 104 can be electrically connected to other interconnect structures such as wires or vias, or to electronic devices, e.g., transistors, within the IC.

View 206 depicts the results of planarizing or leveling, with a polishing process, the top surface of interconnect metal 104 to form planar surface 111. According to embodiments, the polishing process can include a CMP operation that involves the application of chemically active slurry in conjunction with mechanical polishing that is controlled by a computer or other electronic system. Such a computer or other electronic system can be capable of precisely monitoring and controlling polishing by measuring polishing rates, planarity, and the amount of material, e.g., interconnect metal 104, removed and/or remaining.

View 206 depicts the results of polishing operation that has removed the secondary portion(s) 122 and 124 of interconnect metal 104, liner 108/diffusion liner 220, respectively, so that the remaining portion(s) of interconnect metal 104, liner 108, and diffusion liner 220 are contained within the area defined by recess 110. Removal of these secondary material portions 122 and 124 can create a planar surface 111 of interconnect metal 104, which can be useful in creating interconnections having enhanced reliability and electrical performance between interconnect metal 104 and other electrical interconnect structures such as vias and other regions of interconnect metal, within an IC. According to embodiments, a reduced cumulative $\Delta E^0$ between interconnect metal 104 and liner 108 can reduce or eliminate the formation of concave surfaces, e.g., 109, FIG. 1, or convex surfaces, e.g., 113, FIG. 1 and associated slit voids, e.g., 114, FIG. 1 during a polishing operation such as CMP. This reduction of concave and convex surface features can also be referred to as "modulating the surface topology" of interconnect metal 104. The planarization process can be useful in achieving a uniform specified flatness across the planar surface 111 of the interconnect metal 104, in accordance with IC manufacturing tolerances and specifications.

Figure 3:
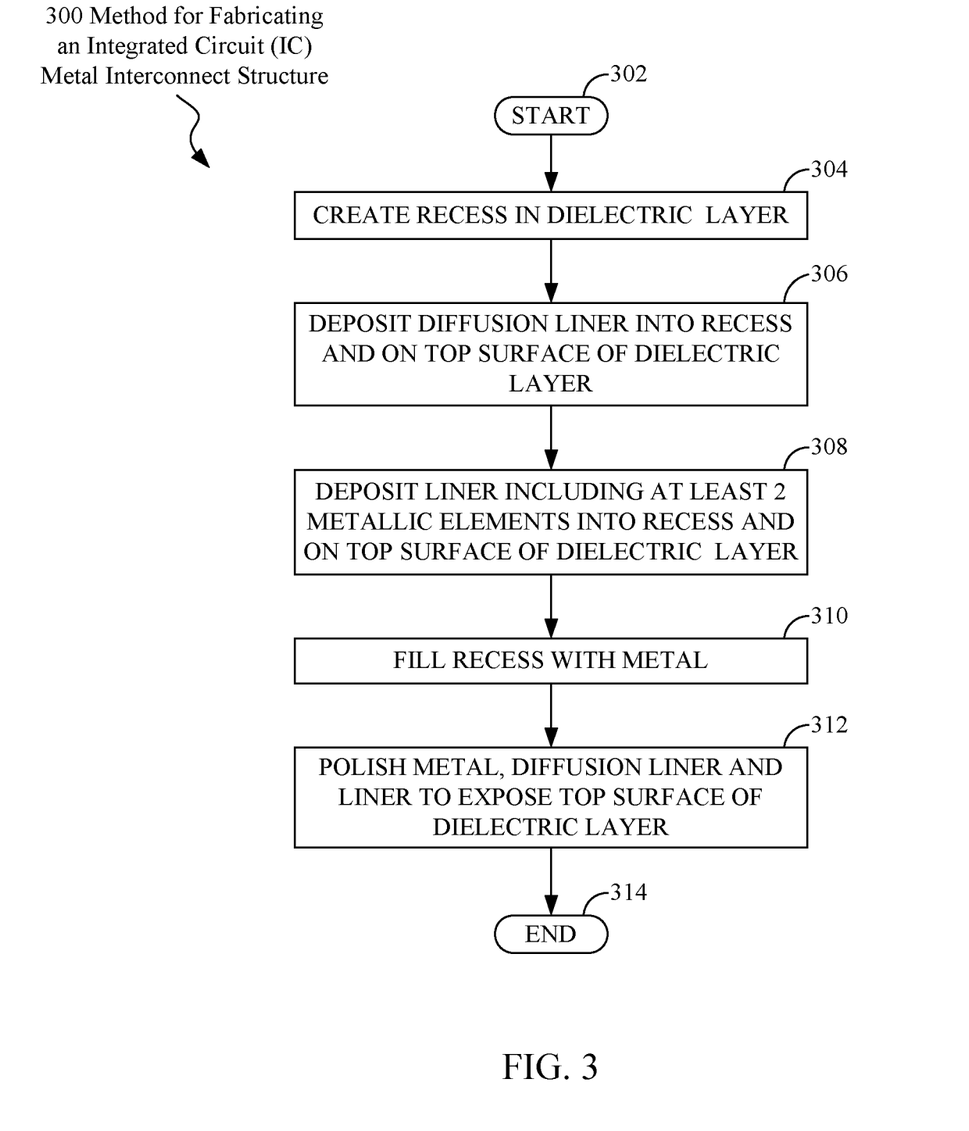
FIG. 3 is a flow diagram illustrating process operations for fabricating an IC metal interconnect structure, according to embodiments consistent with the figures.

FIG. 3 is a flow diagram illustrating operations for fabricating, within an IC, a metal interconnect structure, according to embodiments consistent with the figures. The method for fabricating an IC metal interconnect structure 300 can be useful for creating a metal interconnect structure that has a relatively planar top surface, and that is compatible with existing IC material sets and fabrication technologies. The operations described herein in reference to the method 300 generally correspond to the views 201-208, FIG. 2, and their associated descriptions.

The process 300 moves from start 302 to operation 304. Operation 304 generally refers to the operation(s) that involve creating a recess in a top surface of a dielectric layer of an IC, which generally correspond to the views 201, 202, FIG. 2, and their associated descriptions. A recess created through an etching process includes at least one side and a bottom, which can be useful as a location on which to deposit a diffusion liner or liner layer.

Dimensions of the recess, including width, length and depth, may be calculated and specified in order to create a metal interconnect structure, i.e., wire, suitable to electrically interconnect two or more circuit element, e.g., transistors, of the IC. According to embodiments, the dimensions of the recess may be specified in order to create a metal interconnect structure having a target resistance and/or capacitance value. In embodiments, dimensions of the recess can be consistent with dimensions of a recess used to create a via for interconnecting conductive layers within an IC. Once a recess has been created in the top surface of the dielectric layer, the process moves to operation 306.

Operation 306 is an optional operation that generally refers to depositing a diffusion liner into the recess formed in operation 304, corresponding to the view 203, FIG. 2, and the associated description. According to embodiments, the diffusion liner can be deposited onto the side(s) and bottom of the recess, which can be useful for mitigating the diffusion of interconnect metal into the dielectric material surrounding the recess. A diffusion liner can also be useful in providing a "base" metallic surface upon which to further deposit one or more liner layers in subsequent process operations. According to embodiments, the deposition of a diffusion liner can include materials such as titanium, tantalum, titanium nitride and tantalum nitride. Liner deposition can be accomplished using deposition processes consistent with those used to deposit conductive material within metal layers of an IC, such as PVD, sputter deposition, CVD, ALD and evaporative processes. According to process operations used in IC fabrication, photolithographic techniques involving the use of photomasks and photoresist can be employed in operation 306 in order to restrict an area for the deposition of the diffusion liner. In some embodiments, a secondary portion of the diffusion liner can be deposited, during operation 306, on the top surface of the dielectric layer. Once the conductive liner has been deposited into the recess, the process moves to operation 308.

Operation 308 generally refers to process operation(s) that involve depositing a liner onto either interior surface(s) of the diffusion liner or the side(s) and bottom of the recess, which generally corresponds to view 204, FIG. 2 and its associated description. In embodiments, depositing a liner into the recess or onto the diffusion liner includes the deposition of at least two metallic elements or compounds. One of the elements or compounds has an $E^0$ greater than the $E^0$ of an interconnect metal, while another of the elements or compounds has an $E^0$ less than that of the interconnect metal. The resulting "balancing" of the $E^0$s through the use of the at least two metallic elements or compounds can be useful in reducing the cumulative difference between the liner $E^0$ and that of the interconnect metal. This reduced cumulative $\Delta E^0$ can be effective in mitigating surface artifacts that result from galvanic voltages present between the liner in the interconnect metal during a polishing process such as CMP. Such surface artifacts can include surfaces that are convex, concave and/or contain "slit voids," as depicted in FIG. 1. In some embodiments, the liner can include at least two metallic elements or compounds that are simultaneously co-deposited, as one layer, onto the diffusion liner or recess walls and bottom. In some embodiments, the liner can include two or more individual layers, each containing one metallic element or compound. According to embodiments, a liner can provide a "seeding" surface from which to subsequently electroplate an interconnect metal such as copper. Once the liner has been deposited onto the diffusion liner or recess sides and bottom, the process moves to operation 310.

Operation 310 generally refers to the process operation(s) that involve filling the unfilled portion of the recess with interconnect metal to form a metal interconnect structure, which generally corresponds to view 205, FIG. 2, and its associated description.

According to embodiments, an interconnect metal such as copper or alloys containing copper can be deposited within the recess through the use of processes consistent with those used for IC metal deposition. Such processes can include electroplating, PVD, CVD and ALD. Such deposition process(s) can include the use of photolithographic operations and materials consistent with processes and materials used in creating conductive structures within ICs. In some embodiments, a secondary portion of the interconnect metal can be deposited onto a secondary portion of the liner that was previously deposited onto a top surface of the dielectric layer. Once the recess has been filled with interconnect metal, the process moves to operation 312.

Operation 312 generally refers to the process operation(s) that involve leveling or planarizing the interconnect metal, to form a metal interconnect structure, through a polishing operation such as CMP, which generally corresponds to view 206, FIG. 2, and its associated description. According to embodiments, following filling the recess with an electrically conductive material, the top surface of the electrically conductive material can be polished or planarized using, for example, a CMP process. Polishing or etching the electrically conductive material can be useful in providing a substantially planar top surface, which can facilitate subsequent IC processing operations such as deposition of dielectric and metal layers. The reduction of the cumulative $\Delta E^0$ between the liner and the interconnect metal can be useful in reducing or eliminating the formation of interconnect metal surface artifacts such as dishing or slit voids during the polishing operation. Once the top surface of the interconnect metal has been planarized through the polishing operation, the process 300 may end at block 314.

Figure 4:
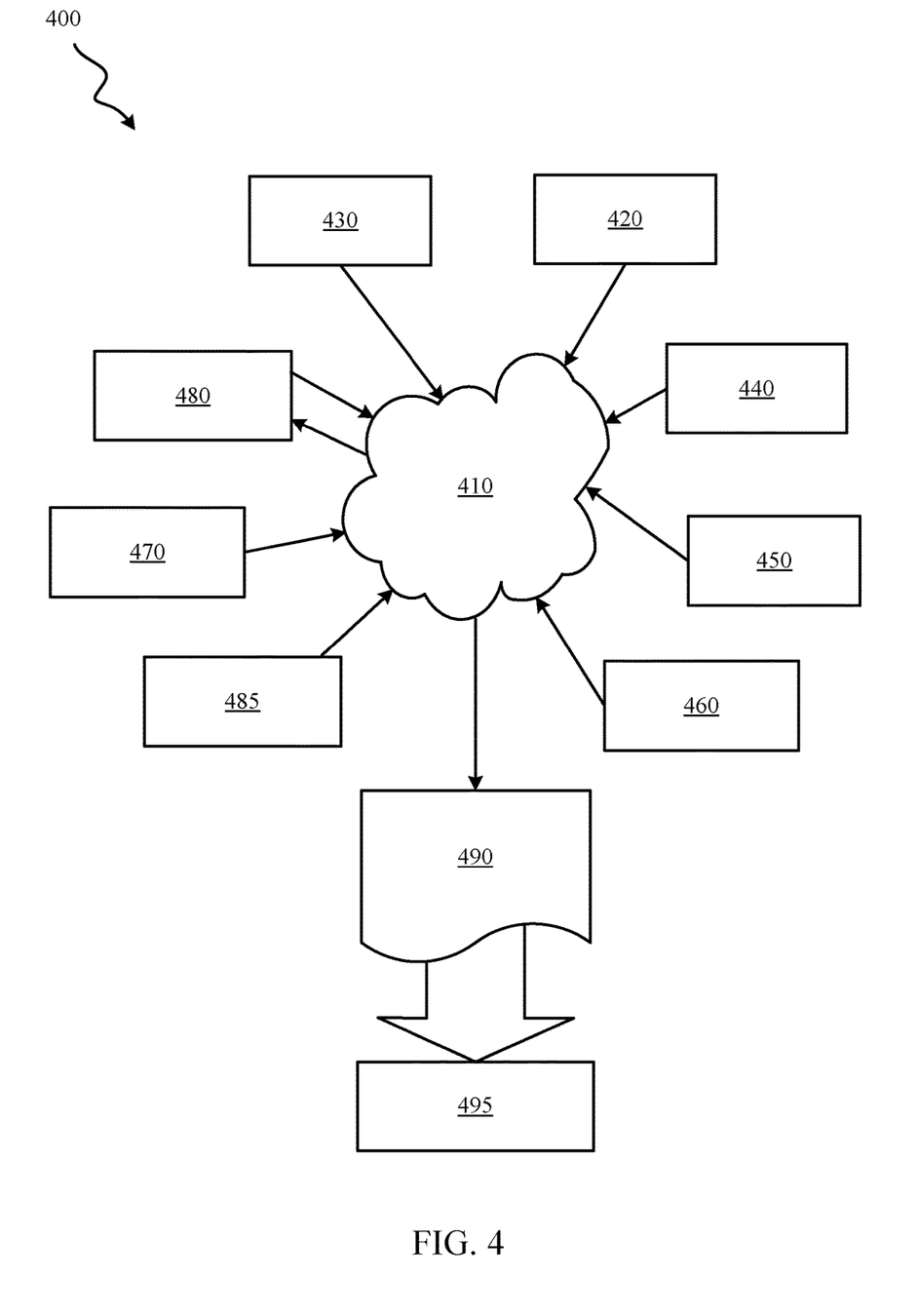
FIG. 4 illustrates multiple design structures including an input design structure that is preferably processed by a design process, according to embodiments consistent with the figures.

FIG. 4 illustrates multiple design structures 400 including an input design structure 420 that is preferably processed by a design process, according to embodiments consistent with the figures. Design structure 420 may be a logical simulation design structure generated and processed by design process 410 to produce a logically equivalent functional representation of a hardware device. Design structure 420 may alternatively include data or program instructions that, when processed by design process 410, generate a functional representation of the physical structure of a hardware device. Whether representing functional or structural design features, design structure 420 may be generated using electronic computer-aided design, such as that implemented by a core developer/designer. When encoded on a machine-readable data transmission, gate array, or storage medium, design structure 420 may be accessed and processed by one or more hardware or software modules within design process 410 to simulate or otherwise functionally represent an electronic component, circuit, electronic or logic module, apparatus, device, or system such as those shown in FIG. 2, or a circuit personalized or modified by the methods described in reference to FIG. 3. As such, design structure 420 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 410 preferably employs and incorporates hardware or software modules for synthesizing, translating, or otherwise processing a design/simulation functional equivalent of the components, circuits, devices, or logic structures shown in FIG. 2, or a circuit personalized or modified by the methods described in reference to FIG. 3, to generate a Netlist 480 which may contain design structures such as design structure 420. Netlist 480 may comprise, for example, compiled or otherwise processed data structures representing a list of wires, discrete components, logic gates, control circuits, I/O devices, models, etc. that describe the connections to other elements and circuits in an integrated circuit design. Netlist 480 may be synthesized using an iterative process in which Netlist 480 is resynthesized one or more times depending on design specifications and parameters for the device. As with other design structure types described herein, Netlist 480 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 410 may include hardware and software modules for processing a variety of input data structure types including Netlist 480. Such data structure types may reside, for example, within library elements 430 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 440, characterization data 450, verification data 460, design rules 470, and test data files 485 which may include input test patterns, output test results, and other testing information. Design process 410 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 410, without deviating from the scope and spirit of the invention. Design process 410 may also include modules for performing standard circuit design processes such as timing analysis, verification, design rule checking, place and route operations, etc.

Design process 410 employs and incorporates logic and physical design tools such as HDL compilers and simulation model build tools to process design structure 420 together with some or all of the depicted supporting data structures, along with any additional mechanical design or data, to generate a second design structure 490. Design structure 490 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 420, design structure 490 preferably comprises one or more files, data structures, or other computer-encoded data or instructions that reside on transmission or data storage media and that, when processed by an ECAD system, generate a logically or otherwise functionally equivalent form of one or more of the embodiments of the invention shown in FIG. 2, or a circuit personalized or modified by the methods described in reference to FIG. 3. In one embodiment, design structure 490 may comprise a compiled, executable HDL simulation model that functionally simulates the devices shown in FIG. 2, or a circuit personalized or modified by the methods described in reference to FIG. 3.

Design structure 490 may also employ a data format used for the exchange of layout data of integrated circuits and/or symbolic data format (e.g., information stored in a GDSII, GL1, OASIS, map files, or any other suitable format for storing such design data structures). Design structure 490 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 2, or a circuit personalized or modified by the methods described in reference to FIG. 3. Design structure 490 may then proceed to a state 495 where, for example, design structure 490 proceeds to tape-out, is released to manufacturing, is released to a mask house, is sent to another design house, is sent back to the customer, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for fabricating, within an integrated circuit (IC), a metal interconnect structure having a top surface topography that is modulated by a surface modulation liner, the method comprising:

selecting, according to standard electrode potentials, at least two dissimilar metallic elements, a first element of the at least two dissimilar metallic elements having a first standard electrode potential greater than a standard electrode potential of an interconnect metal, a second element of the at least two dissimilar metallic elements having a second standard electrode potential less than the standard electrode potential of the interconnect metal;

creating, in a top surface of a dielectric layer of the IC, a recess having at least one side and a bottom;

forming a surface modulation liner by depositing the at least two dissimilar metallic elements onto the at least one side and onto the bottom of the recess;

forming the metal interconnect structure by filling a portion of the recess not filled by the surface modulation liner with the interconnect metal, the interconnect metal being physically separated from the dielectric layer by the surface modulation liner; and modulating, with a polishing process, the surface topography of the metal interconnect structure by removing a top portion of the interconnect metal and a top portion of the surface modulation liner, wherein the difference between the first standard electrode potential and the second standard electrode potential provides for a modulated top surface topography of the metal interconnect structure.

2. The method of claim 1, wherein forming the surface modulation liner further includes depositing a secondary portion of the surface modulation liner onto the top surface of the dielectric layer.

3. The method of claim 2, wherein forming the metal interconnect structure includes depositing a secondary portion of the interconnect metal onto the secondary portion of the surface modulation liner.

4. The method of claim 3, wherein modulating the surface topography of the metal interconnect structure includes removing the secondary portion of the surface modulation liner and the secondary portion of the interconnect metal.

5. The method of claim 1, wherein the polishing process includes a chemical-mechanical planarization (CMP) operation.

6. The method of claim 1, wherein creating the recess includes use of at least one process selected from the set of processes consisting of: dry etching, plasma etching, and reactive ion etching.

7. The method of claim 1, wherein forming the surface modulation liner by depositing the at least two dissimilar metallic elements includes using at least one process selected from the group of processes consisting of: physical vapor deposition (PVD), sputter deposition, chemical vapor deposition (CVD), atomic layer deposition (ALD), and evaporation.

8. The method of claim 1, wherein forming the surface modulation liner by depositing the at least two dissimilar metallic elements includes simultaneously co-depositing the at least two dissimilar metallic elements to form a surface modulation liner that is a metallic alloy.

9. The method of claim 8, wherein:
the difference between the cumulative standard electrode potential of the alloy and the standard electrode potential of the interconnect metal is less than the difference between the first standard electrode potential and the standard electrode potential of the interconnect metal; and
the difference between the cumulative standard electrode potential of the alloy and the standard electrode potential of the interconnect metal is also less than the difference between the second standard electrode potential and the standard electrode potential of the interconnect metal.

10. The method of claim 8, wherein proportions of each of the at least two dissimilar metallic elements are calculated to result in the surface modulation liner having a standard electrode potential within a specified voltage range of the standard electrode potential of the interconnect metal.

11. The method of claim 10, wherein the proportions of each of the at least two dissimilar metallic element are calculated to result in the surface modulation liner having a standard electrode potential within 0.1 V of the standard electrode potential of the interconnect metal.

12. The method of claim 1, wherein forming the metal interconnect structure by filling, with the interconnect metal, the portion of the recess not filled by the surface modulation liner includes using at least one process selected from the set of processes consisting of: electroplating, physical vapor deposition (PVD), chemical vapor deposition (CVD) and atomic layer deposition (ALD).

13. The method of claim 1, wherein forming the surface modulation liner by depositing the at least two dissimilar metallic elements includes:
forming, onto the at least one side and onto the bottom of the recess, a first surface modulation liner layer that includes the first element of the at least two dissimilar metallic elements; and
forming, onto an interior surface of the first surface modulation liner layer, a second surface modulation liner layer that includes the second element of the at least two dissimilar metallic elements.

* * * * *